US006982910B2

(12) United States Patent
Yamase

(10) Patent No.: US 6,982,910 B2
(45) Date of Patent: Jan. 3, 2006

(54) REVERSE VOLTAGE GENERATION CIRCUIT

(75) Inventor: Shinya Yamase, Ota (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/058,429

(22) Filed: Feb. 16, 2005

(65) Prior Publication Data

US 2005/0185469 A1 Aug. 25, 2005

(30) Foreign Application Priority Data

Feb. 19, 2004 (JP) ............................ 2004-042462

(51) Int. Cl.
*G11C 7/00* (2006.01)

(52) U.S. Cl. ................................ 365/189.09; 257/536

(58) Field of Classification Search ........... 365/189.09, 365/226; 327/536; 345/211
See application file for complete search history.

(56) References Cited

U.S. PATENT DOCUMENTS 5,399,928 A * 3/1995 Lin et al. .................... 327/434
2004/0145583 A1 * 7/2004 Morita ....................... 345/211

FOREIGN PATENT DOCUMENTS

JP 2001-258241 9/2001

* cited by examiner

*Primary Examiner*—Vu A. Le
(74) *Attorney, Agent, or Firm*—Morrison & Foerster LLP

(57) ABSTRACT

An improved reverse voltage generation circuit is offered. The reverse voltage generation circuit can be formed in a single semiconductor substrate, prevents leakage current of constituting MOS transistors and stabilizes operation of the circuit. A first and a second charge transfer MOS transistors and a first and a second driver MOS transistors are formed in a surface of a P-type semiconductor substrate. The first charge transfer MOS transistor and the first and the second driver MOS transistors are of a P-channel type, and formed in a first N-well, a second N-well and a third N-well, respectively. The first, the second and the third N-wells are formed in a surface of a P-type semiconductor substrate. The second charge transfer MOS transistor is of an N-channel type and formed in the surface of the P-type semiconductor substrate. A power supply voltage is applied to a source of the first driver MOS transistor and an inverted voltage is generated and outputted from a drain of the second charge transfer MOS transistor.

5 Claims, 4 Drawing Sheets

REVERSE VOLTAGE GENERATION CIRCUIT

CROSS-REFERENCE OF THE INVENTION

This invention is based on Japanese Patent Application No. 2004-042462, the content of which is incorporated herein by reference in its entirety.

BACKGROUND OF THE INVENTION

1. Field of the Invention

This invention relates to a reverse voltage generation circuit that generates a voltage of the opposite polarity to an input voltage.

2. Description of the Related Art

The reverse voltage generation circuit is used as a power supply to an LCD (Liquid Crystal Display) driver circuit that provides an active matrix type LCD panel with gate signals, for example. The reverse voltage generation circuit generates a negative voltage (−15V) from a positive voltage (+15V), for example.

FIG. 5 is a circuit diagram of a reverse voltage generation circuit according to prior art. The reverse voltage generation circuit is composed of a first and a second charge transfer MOS transistors TR21 and TR22 of an N-channel type, a first and a second level shift circuits LS21 and LS22 which control turning on and off of the first and the second charge transfer MOS transistors TR21 and TR22 respectively, a capacitor 10 (usually a capacitor externally connected to an integrated circuit) and a driver circuit 11 that is a CMOS inverter made of a first driver MOS transistor TR23 of a P-channel type and a second driver MOS transistor TR24 of the N-channel type.

The first and the second charge transfer transistors TR21 and TR22 are simply referred to as TR21 and TR22 in the following explanation, as well as referring to the first and the second driver MOS transistors TR23 and TR24 simply as TR23 and TR24.

An example operation of the circuit will be described hereafter. An input signal S23 to a gate of TR23 and an input signal S24 to a gate of TR24 are turned to a low level (Vss) to turn TR23 on and turn TR24 off, after TR22 is turned off by the second level shift circuit LS22. Then TR21 is turned on by the first level shift circuit LS21. As a result, a node N23 that is an output node of the driver circuit 11 is set to a voltage VH, while a node N21 that is a point of connection between TR21 and TR22 is pulled to a ground voltage (reference voltage) Vss.

Next, after turning TR21 off, the input signal S23 to the gate of TR23 and the input signal S24 to the gate of TR24 are turned to a high level (VH) to turn TR23 off and turn TR24 on. After that, when TR22 is turned on, a voltage at the node N21 is lowered due to a capacitive coupling through the capacitor 10, a current flows from the node N22 to the node N21 through TR22 and a voltage at the node N22 and a voltage at an output terminal 20 connected to the node N22 are lowered.

Next, after turning TR22 off, the input signal S23 to the gate of TR23 and the input signal S24 to the gate of TR24 are turned to the low level (Vss) to turn TR23 on and turn TR24 off. Then TR21 is turned on by the first level shift circuit LS21 to return to the initial state. Repeating the operation described above brings the node N22 to −VH that is a reverse polarity voltage of the voltage VH. Therefore, the negative voltage −VH is generated from the positive voltage VH with this reverse voltage generation circuit.

The input signals S21 and S22 to the first and the second level shift circuits LS21 and LS22 are determined based on a voltage-logic assuming the voltage VH as the high level and the ground voltage Vss as the low level. The first and the second level shift circuits LS21 and LS22 convert the input signals swinging between the voltage VH and the ground voltage Vss to signals swinging between the voltage VH and a voltage at the node N22, in order that TR21 and TR22 are completely turned off. When the reverse voltage generation circuit reaches a stationary state after repeating the operation described above, the voltage at the node N21 swings between the ground voltage Vss and −VH and the voltage at the node N22 becomes −VH.

The reverse voltage generation circuit described above has been manufactured by a CMOS process using an N-type semiconductor substrate. Relevant descriptions on the technologies mentioned above are provided, for example, Japanese Patent Publication No. 2001-258241.

A lowest voltage provided to an LSI (Large Scale Integration) is applied to a substrate of N-channel MOS transistors in an ordinary LSI in order to reverse-bias P-N junctions. In a reverse voltage generation circuit LSI that generates a negative voltage from a positive voltage, however, a substrate of an N-channel MOS transistor connected to the generated voltage needs to be connected to the generated voltage or a voltage lower than the generated voltage, since the reverse voltage generation circuit generates the voltage lower than the voltage provided to the LSI.

And if the substrate voltage of all N-channel MOS transistors in the reverse voltage generation circuit is unified to the generated voltage, driving capacity of an N-channel transistor having a source connected to the ground voltage Vss (TR21 and TR24, for example) is reduced since a back-gate bias is applied to the N-channel MOS transistor. Therefore, the N-channel MOS transistors are separated from each other with individual P-wells.

Increasing need in recent years for integrating the reverse voltage generation circuit into an LSI as a power supply requires integrating the reverse voltage generation circuit not only into an LSI using an N-type semiconductor substrate but also into an LSI using a P-type semiconductor substrate.

However, when the reverse voltage generation circuit of FIG. 5 is formed in the P-type semiconductor substrate, there arises a problem described below. The N-channel MOS transistors TR21, TR22 and TR24 are formed in the P-type semiconductor substrate. And the substrate voltage of these transistors is made to be the output voltage of the reverse voltage generation circuit (the output voltage of TR22). However, the output voltage is not yet generated at the time the power supply is turned on (at the beginning of the operation of the circuit). As a result, the substrate voltage of the transistors is unstable when the power supply is turned on. If the substrate voltage is somewhat higher than the ground voltage Vss, the transistor with its source connected to the ground voltage Vss is back-gate biased with a reverse voltage, leading to a reduction in a threshold voltage and possibly to causing a leakage current in the transistor.

SUMMARY OF THE INVENTION

A reverse voltage generation circuit of this invention includes a first charge transfer MOS transistor having a first diffused region connected to a ground, a second charge transfer MOS transistor having a first diffused region connected to a second diffused region of the first charge transfer MOS transistor, a first driver MOS transistor having a first diffused region to which a power supply voltage VH is provided, a second driver MOS transistor having a first diffused region connected to a second diffused region of the first driver MOS transistor and a second diffused region connected to the ground, a capacitor with one end connected to a connecting point between the first charge transfer MOS transistor and the second charge transfer MOS transistor and the other end connected to a connecting point between the first driver MOS transistor and the second driver MOS transistor and a control circuit that controls turning on and off of the first and the second charge transfer MOS transistors and the first and the second driver MOS transistors, and outputs a reverse voltage −VH that is an inverted polarity voltage of the power supply voltage VH from a second diffused region of the second charge transfer MOS transistor. The first charge transfer MOS transistor and the first and the second driver MOS transistors are formed of a P-channel type, while the second charge transfer MOS transistor is formed of an N-channel type. The second charge transfer MOS transistor is formed in a surface of a P-type semiconductor substrate, the first charge transfer MOS transistor is formed in a first N-well formed in the P-type semiconductor substrate and its first diffused region is connected to the first N-well, the first driver MOS transistor is formed in a second N-well formed in the P-type semiconductor substrate and its first diffused region is connected to the second N-well and the second driver MOS transistor is formed in a third N-well formed in the P-type semiconductor substrate and its first diffused region is connected to the third N-well.

DETAILED DESCRIPTION OF THE INVENTION

Figure 1:
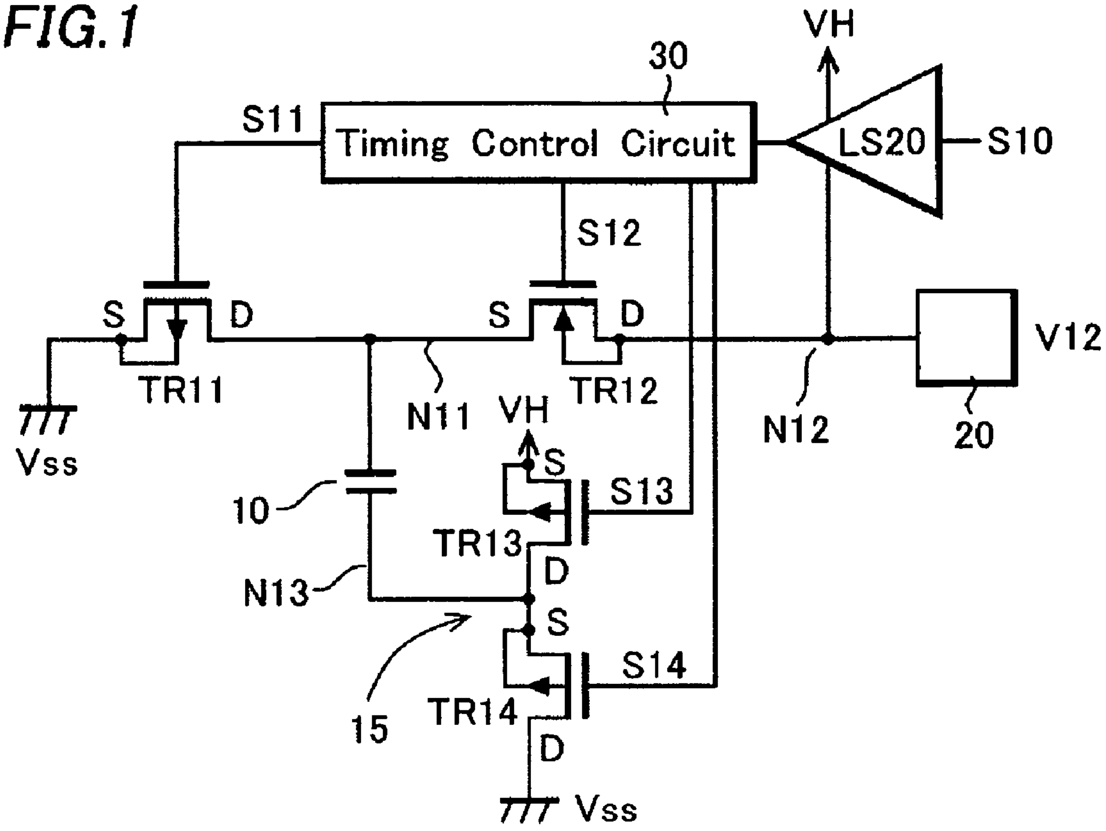
FIG. 1 is a circuit diagram showing a reverse voltage generation circuit according to an embodiment of this invention.

A reverse voltage generation circuit according to an embodiment of this invention will be explained referring to FIG. 1 hereafter.

The reverse voltage generation circuit is formed in a P-type semiconductor substrate and includes a first charge transfer MOS transistor TR11 of a P-channel type, a second charge transfer MOS transistor TR12 of an N-channel type and a driver circuit 15 made of an EE (Enhancement-Enhancement) inverter including a first driver MOS transistor TR13 of the P-channel type and a second driver MOS transistor TR14 of the P-channel type.

The reverse voltage generation circuit further includes a level shift circuit LS20 which converts an input signal S10 swinging between a first power supply voltage Vdd and a ground voltage (reference voltage) Vss to a signal swinging between a second power supply voltage VH (VH>Vdd) and the ground voltage Vss, a timing control circuit 30 which generates timing control signals S11, S12, S13 and S14 based on an output of the level shift circuit LS20 and controls turning on and off of the first and the second charge transfer MOS transistors TR11 and TR12 and the first and the second driver MOS transistors TR13 and TR14 according to the timing control signals and a capacitor 10 (a capacitor externally connected to an integrated circuit, for example) connected between a connecting point (node N11) between the first charge transfer MOS transistor TR11 and the second charge transfer MOS transistor TR12 and an output node (node N13) of the driver circuit 15.

The reverse voltage generation circuit outputs a voltage −VH, a reverse polarity voltage of the second power supply voltage VH, from an output terminal 20 connected to a second diffused region (hereafter referred to as a drain) (node N12) of the second charge transfer MOS transistor TR12. The first and the second charge transfer transistors TR11 and TR12 are simply referred to as TR11 and TR12 in the following explanation, as well as referring to the first and the second driver MOS transistors TR13 and TR14 simply as TR13 and TR14.

Figure 2:
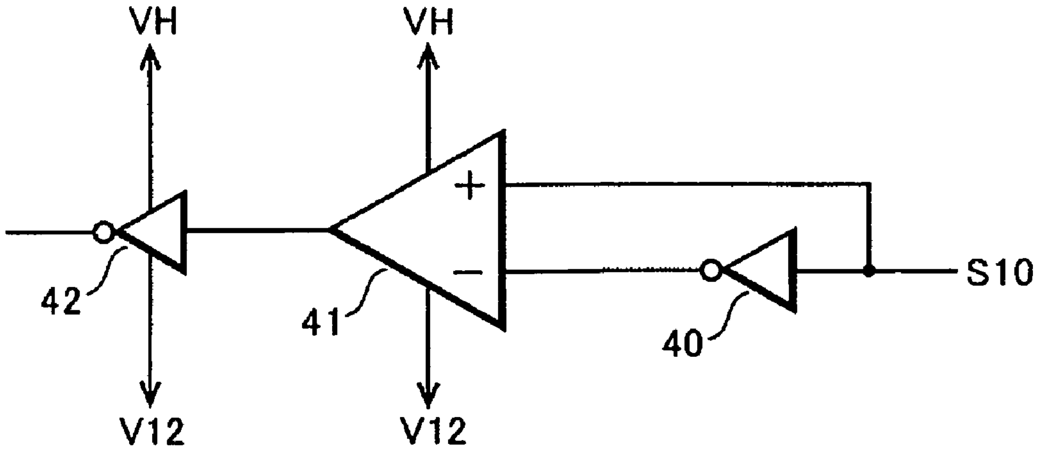
FIG. 2 is a circuit diagram showing a level shift circuit according to the embodiment of this invention.

FIG. 2 is a circuit diagram showing the level shift circuit LS20. The input signal S10 (clock signal) is applied to a non-inverted input terminal (+) of a comparator 41 while the input signal S10 inverted by an inverter 40 is applied to an inverted input terminal (−) of the comparator 41. The comparator 41 is provided with the second power supply VH as a positive power supply voltage and a voltage V12 at the node N12 as a negative power supply voltage. An output of the comparator 41 is applied to an inverter 42. The inverter 42 is also provided with the same positive power supply voltage VH and the negative power supply voltages V12 as the comparator 41. And the inverter 42 outputs a level-shifted voltage. The input signal S10 swinging between Vdd and Vss can be converted to a signal swinging between VH and the voltage V12 at the node N12 with the level shift circuit LS20.

Figure 3:
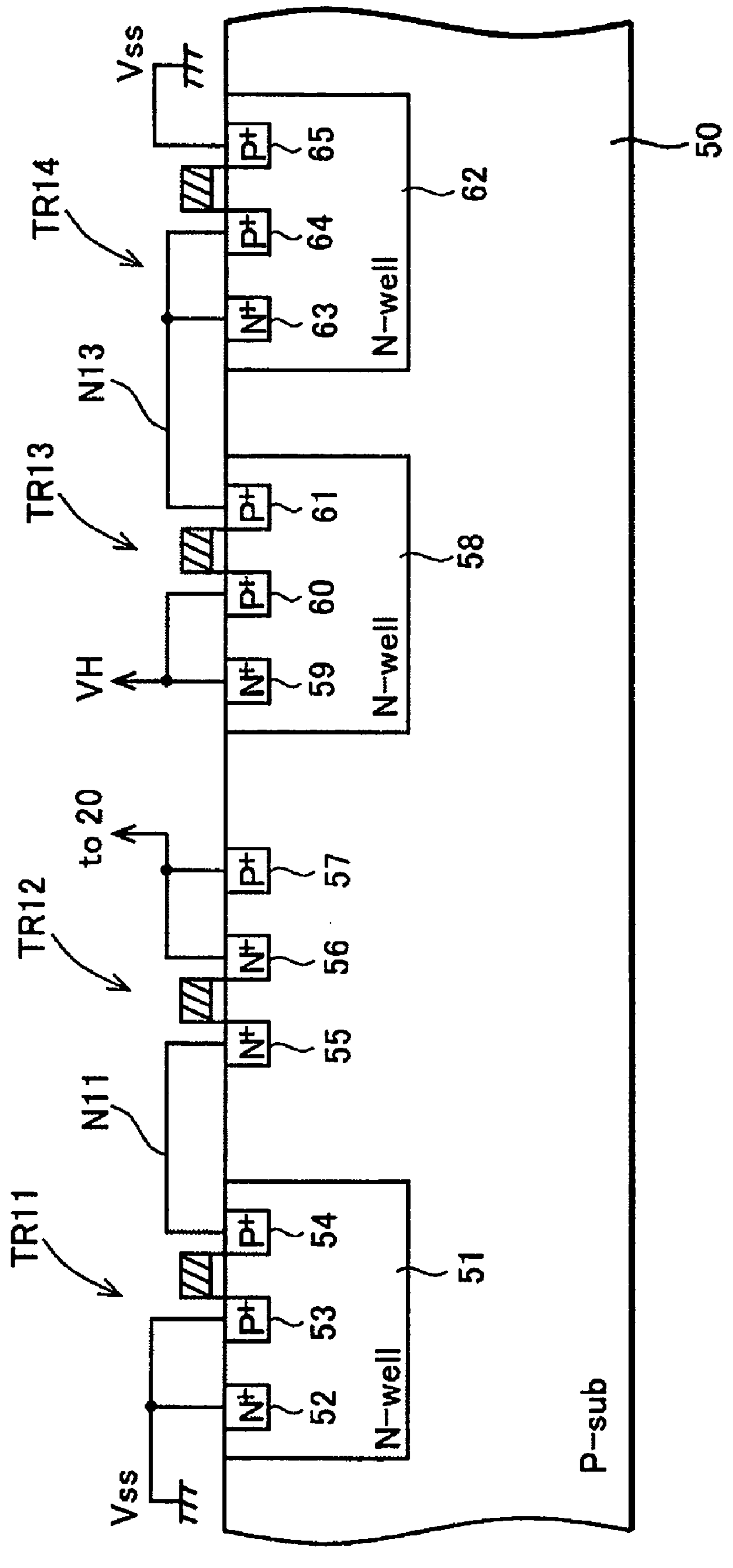
FIG. 3 is a cross-sectional view showing MOS transistors constituting the reverse voltage generation circuit according the embodiment of this invention.

Next, device structures of the first and the second charge transfer MOS transistors TR11 and TR12 and the first and the second driver transistors TR13 and TR14 will be explained referring to FIG. 3. The transistors TR11, TR12, TR13 and TR14 are formed in a P-type semiconductor substrate 50.

TR11 is formed in a first N-well 51 formed in a surface of the P-type semiconductor substrate 50. A $P^+$-type first diffused region (hereafter referred to as a source layer) 53 of TR11 is connected with the first N-well 51 through an $N^+$-type layer 52 formed in a surface of the first N-well 51. TR11 is electrically separated from the P-type semiconductor substrate 50 and the other transistors with the first N-well 51. The ground voltage Vss is applied to the $P^+$-type source layer 53. As a result, a voltage of the first N-well 51 is stabilized at Vss, not being influenced by fluctuation in voltage of the P-type semiconductor substrate 50 or the other transistors and keeping TR51 from the back-gate bias effect.

TR12 is formed in the surface of the P-type semiconductor substrate 50. An $N^+$-type first diffused region (hereafter referred to as a source layer) 55 of TR12 is connected to a $P^+$-type second diffused region (hereafter referred to as a drain layer) 54 of TR11. An $N^+$-type second diffused region (hereafter referred to as a drain layer) 56 of TR12 is connected to the P-type semiconductor substrate 50 through a $P^+$-type layer 57 formed in the surface of the P-type semiconductor substrate 50. Although the P-type semiconductor substrate 50 is set at the output voltage of the reverse voltage generation circuit generated at the drain layer 56 of TR12, the back-gate bias effect is prevented because the drain layer 56 is connected with the P-type semiconductor substrate 50.

TR13 is formed in a second N-well 58 formed in the surface of the P-type semiconductor substrate 50. A $P^+$-type first diffused region (hereafter referred to as a source layer) 60 of TR13 is connected with the second N-well 58 through an $N^+$-type layer 59 formed in a surface of the second N-well 58. TR13 is electrically separated from the P-type semiconductor substrate 50 and the other transistors with the second N-well 58. The second power supply voltage VH is applied to the source layer 60. As a result, a voltage of the second N-well 58 is stabilized at VH, not being influenced by fluctuation in voltage of the P-type semiconductor substrate 50 or the other transistors and keeping TR13 from the back-gate bias effect.

TR14 is formed in a third N-well 62 formed in the surface of the P-type semiconductor substrate 50. A $P^+$-type first diffused region (hereafter referred to as a source layer) 64 of TR14 is connected with the third N-well 62 through an $N^+$-type layer 63 formed in a surface of the third N-well 62. TR14 is electrically separated from the P-type semiconductor substrate 50 and the other transistors with the third N-well 62. As a result, a voltage of the third N-well 62 is stabilized at a voltage of the source layer 64, not being influenced by fluctuation in voltage of the P-type semiconductor substrate 50 or the other transistors and keeping TR14 from the back-gate bias effect.

Figure 4:
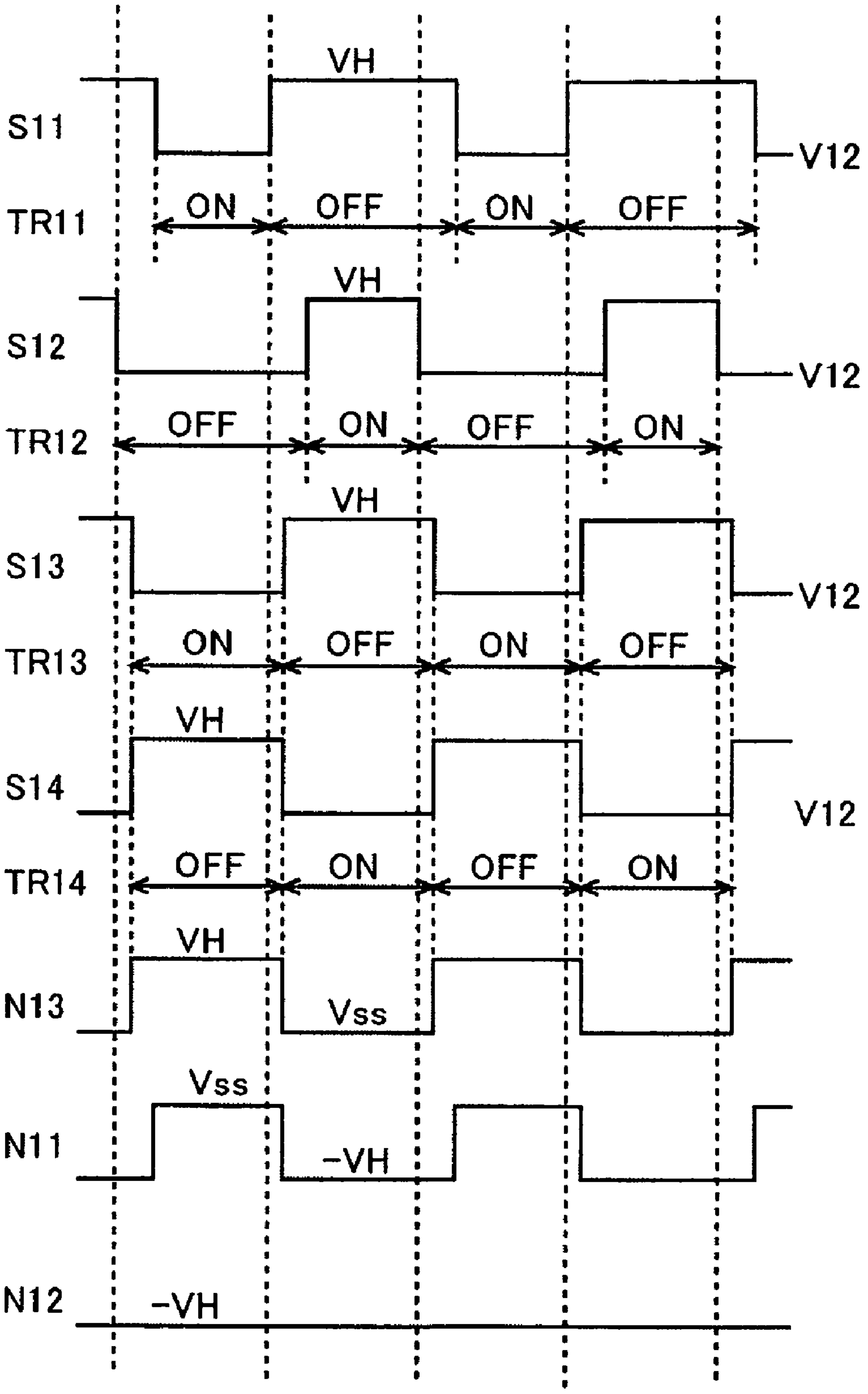
FIG. 4 is a timing chart showing an operation of the reverse voltage generation circuit according to the embodiment of this invention.
Figure 5:
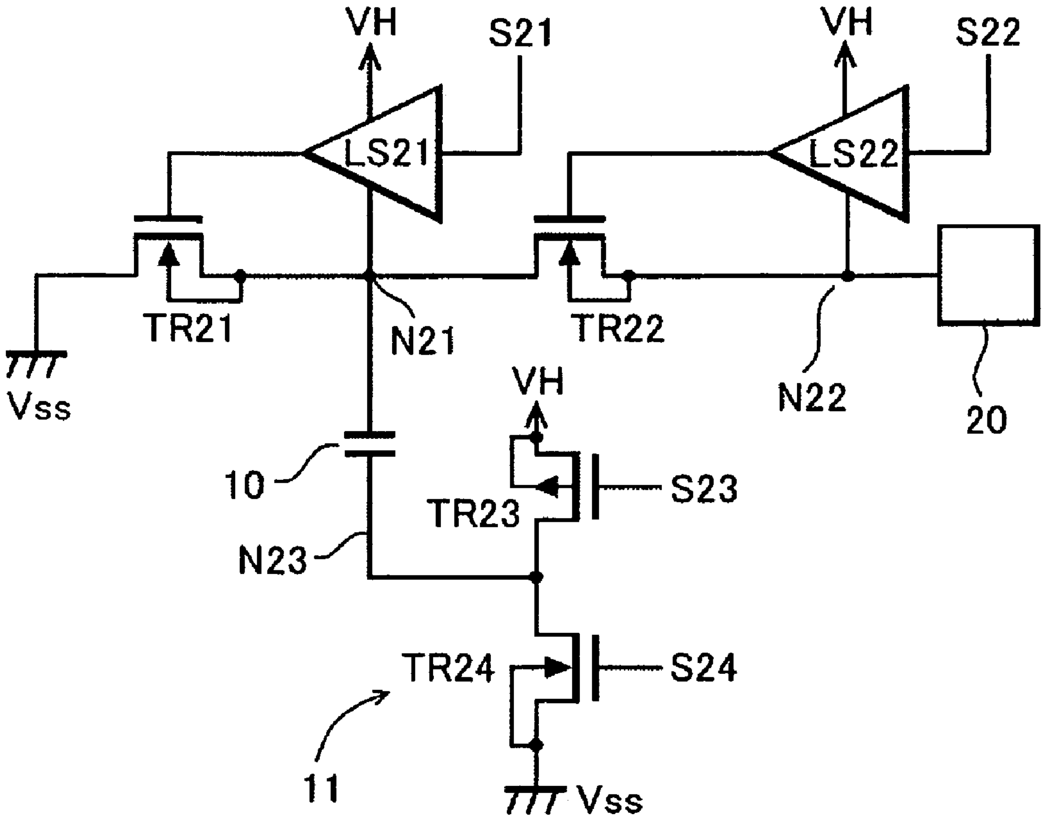
FIG.5 PRIOR ART
FIG. 5 is a circuit diagram showing a reverse voltage generation circuit according to a prior art.

Next, an example of operation of the reverse voltage generation circuit will be explained referring to FIG. 4. FIG. 4 is an operational timing chart of the circuit in a stationary state. After the signal S12 is turned to the low level (the voltage V12 at the node N12) to turn TR12 off, the input signal S13 to a gate of TR13 is turned to the low level (V12) and the input signal S14 to a gate of TR14 is turned to the high level (VH) by the timing control circuit 30 to turn TR13 on and turn TR14 off.

Then the signal S11 is turned to the low level (V12) to tu TR11 on. As a result, the node N13 that is the output node of the driver circuit 15 is set to the voltage VH while the node N11 that is the connecting point between TR11 and TR12 is pulled to the ground voltage Vss. The reason why TR12 is turned off at first is to prevent a reverse current from the node N11 to the node N12 through TR12.

Next, after the signal S11 is turned to the high level (VH) to turn TR11 off, the input signal S13 to the gate of TR13 is turned to the high level (VH) and the input signal S14 to the gate of TR14 is turned to the low level (V2) to turn TR13 off and TR14 on. As a result, the voltage at the node N13, that is the output node of the driver 15, varies from VH to Vss and the voltage at the node N11 is pulled down by capacitive coupling through the capacitor 10. Then, by turning the signal S12 to the high level (VH) to turn TR12 on, a current flows from the node N12 to the node N11 to lower the voltage V12 at the node N12 and thus the voltage at the output terminal 20 that is connected to the node N12. The reason why the output of the driver circuit 15 is varied after turning TR11 off is to prevent a reverse current from the ground to the node N11 through TR11 from occurring.

Next, after the signal S12 is turned to the low level (V12) to turn TR12 off, the input signal S13 to the gate of TR13 is turned to the low level (V12) and the input signal S14 to the gate of TR14 is tued to the high level (VH) to turn TR13 on and TR14 off. Then the signal S11 is turned to the low level (V12) to turn TR11 on, resuming to the initial state. Repeating the operation described above brings the node N12 to −VH that is a reverse voltage of the second power supply voltage VH.

It is made possible according to the embodiment as described above that the negative voltage −VH is obtained from the positive voltage VH, and that the leakage current due to the back-gate bias effect is prevented since the P-channel transistors TR11, TR13 and TR14 are formed in the first, the second and the third N-wells 51, 58 and 62 respectively and electrically separated from each other and the P-type semiconductor substrate 50.

Although the reverse voltage generation circuit in the embodiment generates the negative voltage (−15V, for example) from the positive voltage (+15v, for example), it is also possible to generate a positive voltage (+15V, for example) from a negative voltage (−15V, for example) based on the same technical idea. In this case, an N-type semiconductor substrate is used instead of the P-type semiconductor substrate 50 and the conductivity type of the wells and the channel types of the MOS transistors are reversed.

To describe more specifically, the first charge transfer MOS transistor TR11, the first driver MOS transistor TR13 and the second driver MOS transistor TR14 are made of N-channel MOS transistors and each of them is formed in an individual P-well isolated from each other. The second charge transfer MOS transistor TR12 is made of a P-channel MOS transistor and formed in a surface of the N-type semiconductor substrate. The level shift circuit LS20 is modified to convert the input signal S10 to a signal swinging between the negative voltage (−15V) and the voltage at the node N12.

As a result, the transistors can be controlled based on the output signals S11, S12, S13 and S14 of the timing control circuit 30. The first diffused region of the first driver MOS transistor TR13 is connected to the negative voltage (−15V) while the second diffused region of the second driver MOS transistor TR14 is connected to the ground voltage Vss. As a result, the positive voltage (+15V) is generated and outputted from the second diffused region of the second charge transfer MOS transistor TR12.

According to this invention, the reverse voltage generation circuit is formed in a single semiconductor substrate, leakage current of the constituting MOS transistors is prevented and the operation of the circuit is stabilized. The reverse voltage generation circuit of this invention is suited for a power supply circuit to an LCD driver circuit that provides an active matrix type LCD panel with gate signals.

What is claimed is:

1. A reverse voltage generation circuit comprising:

a semiconductor substrate of a first general conductivity type;

a first well of a second general conductivity type, a second well of the second general conductivity type and a third well of the second general conductivity type that are formed in the semiconductor substrate;

a first charge transfer MOS transistor of a channel type of the first general conductivity type formed in a surface of the first well, comprising a first diffused region of the first general conductivity type that is connected to the first well and a ground providing a ground voltage, and further comprising a second diffused region of the first general conductivity type;

a second charge transfer MOS transistor of a channel type of the second general conductivity type formed in a surface of the semiconductor substrate and comprising a first diffused region of the second general conductivity type connected to the second diffused region of the first charge transfer MOS transistor;

a first driver MOS transistor of the channel type of the first general conductivity type formed in a surface of the second well, comprising a first diffused region of the first general conductivity type that is connected to the second well and a power supply providing a power supply voltage, and further comprising a second diffused region of the first general conductivity type;

a second driver MOS transistor of the channel type of the first general conductivity type formed in a surface of the third well, comprising a first diffused region that is connected to the third well and the second diffused region of the first driver MOS transistor, and further comprising a second diffused region connected to the ground;

a capacitor comprising a terminal connected to the second diffused region of the first charge transfer MOS transistor and the first diffused region of the second charge transfer MOS transistor and another terminal connected to the second diffused region of the first driver MOS transistor and the first diffused region of the second driver MOS transistor; and a control circuit that controls turning on and off of the first charge transfer MOS transistor, the second charge transfer MOS transistor, the first driver MOS transistor and the second driver MOS transistor, wherein a second diffused region of the second general conductivity type of the second charge transfer MOS transistor is configured to output a reverse power supply voltage that is opposite in polarity to the power supply voltage.

2. The reverse voltage generation circuit of claim 1, wherein the first well, the second well and the third well are separated from each other.

3. The reverse voltage generation circuit of claim 1, wherein the second diffused region of the second charge MOS transfer is connected to the semiconductor substrate.

4. The reverse voltage generation circuit of claim 1, wherein the control circuit controls the first and second charge transfer MOS transistors and the first and second driver MOS transistors so that the first charge transfer MOS transistor is turned on, the first driver MOS transistor is turned on, the second driver MOS transistor is turned off while the second charge transfer MOS transistor is turned off in order that a voltage at a connecting point between the first charge transfer MOS transistor and the second charge transfer MOS transistor becomes the ground voltage, and so that the first driver MOS transistor is turned off, the second driver MOS transistor is turned on and the second charge transfer MOS transistor is turned on while the first charge transfer MOS transistor is turned off in order that the voltage at the connecting point between the first charge transfer MOS transistor and the second charge transfer MOS transistor is increased or reduced from the ground voltage by capacitive coupling through the capacitor.

5. The reverse voltage generation circuit of claim 4, wherein the control circuit comprises a level shift circuit that converts an input signal to the control circuit into a signal alternating between the power supply voltage and the reverse power supply voltage outputted from the second diffused region of the second charge transfer MOS transistor and a timing control circuit that controls a timing of an output of the level shift circuit, and outputs of the timing control circuit is applied to gates of the first charge transfer MOS transistor, the second charge transfer MOS transistor, the first driver MOS transistor and the second driver MOS transistor.

* * * * *